(12) United States Patent
Van Andel et al.

(10) Patent No.: US 6,184,057 B1
(45) Date of Patent: *Feb. 6, 2001

(54) METHOD OF MANUFACTURING A PHOTOVOLTAIC FOIL

(75) Inventors: Eleonoor Van Andel, Enschede; Erik Middelman, Arnhem; Rudolf Emmanuel Isidore Schropp, Driebergen, all of (NL)

(73) Assignee: Akzo Nobel NV, Arnhem (NL)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/274,369

(22) Filed: Mar. 23, 1999

Related U.S. Application Data

(63) Continuation of application No. PCT/EP97/05326, filed on Sep. 24, 1997.

(30) Foreign Application Priority Data

Sep. 26, 1996 (EP) .................................................. 96202691

(51) Int. Cl.⁷ .......................... H01L 21/00; H01L 31/048
(52) U.S. Cl. ................................ 438/66; 438/61; 438/74; 438/80; 136/251; 136/244; 136/259
(58) Field of Search .................................. 438/61–69, 57, 438/72, 73, 609, 97, 74, 977, 455, 457, 459; 257/432–435, 443, 447, 448, 458, FOR 447, FOR 448; 136/244, 249, 256, 258, 251, 259

(56) References Cited

U.S. PATENT DOCUMENTS

| | | | |
|---|---|---|---|
| 5,011,782 | * 4/1991 | Lamb et al. | 438/72 |
| 5,069,727 | * 12/1991 | Kouzuma et al. | 136/251 |
| 5,232,860 | 8/1993 | Kawanishi et al. | 437/2 |
| 5,538,902 | * 7/1996 | Izu et al. | 438/66 |

FOREIGN PATENT DOCUMENTS

| | | | |
|---|---|---|---|
| 189976 | 8/1986 | (EP) | H01L/31/18 |
| 55-143706 | 11/1980 | (JP) | |
| 62-123780 | 6/1987 | (JP) | |

OTHER PUBLICATIONS

H. Shinohara et al., "Development of a Residential User, Utility Interactive PV Inverter with High–Frequency Isolation", Solar Energy Materials and Solar Cells 35 (1994) 429–436.

Y. Kishi et al., "Ultralight Flexible Amorphous Silicon Cell and Its Application for an Airplane", Technical Digest of the Internatioanl PVSEC–5, Kyoto, Japan, 1990, A–IIIa–8, pp. 645 to 648.

Photovoltaic Cells, Ullman's Encyclopedia of Industrial Chemistry, vol. A20, p. 161 (1992).

Solar Technology, Ullman's Encyclopedia of Industrial Chemistry, vol. A24, p. 369 (1993).

* cited by examiner

Primary Examiner—Olik Chaudhuri
Assistant Examiner—Hoai Pham
(74) Attorney, Agent, or Firm—Richard P. Fennelly

(57) ABSTRACT

The invention pertains to a method of manufacturing a photovoltaic foil supported by a carrier and comprising a plurality of photovoltaic layers which together have the ability of generating electric current from incident light, a back-electrode layer on one side adjacent and parallel to the photovoltaic layers, and a transparent conductor layer on the other side of, and adjacent and parallel to the photovoltaic layers, which method comprises the following subsequent steps: providing a temporary substrate, applying the transparent conductor layer, applying the photovoltaic layers, applying the back-electrode layer, applying the carrier, removing the temporary substrate, and, preferably, applying a top coat on the side of the transparent conductor layer. The invention enables the roll-to-roll manufacture of a tough photovoltaic foil or device, while at the same time making it possible to use any desired transparent conductor material and deposition process, without jeopardizing the current-generating action of the PV layers.

10 Claims, 4 Drawing Sheets

METHOD OF MANUFACTURING A PHOTOVOLTAIC FOIL

The present application is a continuation of International Application No. PCT/EP97/05326 filed on Sep. 24, 1997.

BACKGROUND OF THE INVENTION

The invention is in the field of thin film photovoltaic cells. For example, amorphous silicon (i.e., a-Si:H) photovoltaic (PV) cells are known structures which comprise several layers, usually alternatingly of n-doped, intrinsic, and p-doped silicon, and which essentially have the ability of generating electric current from incident light. Since sunlight, for example, can be used to generate power, photovoltaic cells form an interesting alternative source of energy in principle: one much more environment-friendly than fossil fuels or nuclear power. However, for such PV cells to become a serious and economically attractive alternative, they need to be provided in a suitable form and made by relatively low-cost processes, using relatively inexpensive raw materials.

SUMMARY OF THE INVENTION

In order to satisfy this demand, the present invention is directed to a process by which photovoltaic cells can be made in the form of a foil. It is not only desirable to have photovoltaic cells in the form of a foil, since such may allow economic production on a large scale (in a "roll-to-roll" process), but also since flexible substrate based photovoltaic cells will be more versatile and easier to handle than the more conventional amorphous silicon PV cells made on glass substrates.

DESCRIPTION OF THE PREFERRED EMBODIMENTS

Thus, the invention pertains to: a method of manufacturing a photovoltaic foil supported by a carrier and comprising a plurality of layers which together have the ability of generating electric current from incident light (hereinafter referred to as "photovoltaic (PV) layers"), a back-electrode layer on one side adjacent and parallel to the photovoltaic layers, and a transparent conductor layer on the other side adjacent and parallel to the photovoltaic layers; the method comprising providing a substrate; and applying the transparent electrode layer and the photovoltaic layers (including any additional and/or adjuvant layers) onto the substrate. At some point, after the photovoltaic layers have been applied, the back-electrode layer is applied. This does not need to be a transparent electrode and, in fact, is preferably a reflector for visible light (both for reflectance and for conductivity, the back-electrode layer will generally be a metal layer). For the sake of clarity, in the context of the present invention, the term "back" pertains to the side of the PV foil that upon eventual use will be facing away from the side on which the light is to fall.

Such a method is known from, for example, Shinohara et al., First WCPEC, Dec. 5–9, 1994, Hawaii, pages 682 and following (copyright: IEEE), where the substrate used is poly(ethylene 2,6-naphthalene dicarboxylate) (PEN). The disclosed method has several serious drawbacks. For example, first the PV layers are built up, and then the transparent conductor. This is a logical consequence of the substrate not being sufficiently transparent, namely, it cannot eventually serve as a window for the transparent conductor layer (which is customary in amorphous silicon PV cells that are made on glass substrates). However, the necessary "reverse" order of first applying the PV layers and then the transparent conductor layer imposes serious limits on the transparent conductor materials used. For example, a very favorable transparent electrode layer is F-doped tin oxide. However, in order for this to have the desired properties and texture, it should preferably be applied at a temperature of at least 400° C. Such a high temperature may be devastating to the PV layers: among other things, as a result of crystallization, the diffusion of the dopants, and/or loss of hydrogen. The preferred temperature for the deposition of F-doped tin oxide also causes the PEN substrates to deteriorate and, therefore, this layer cannot be deposited prior to the PV layers. Thus, with the use of the desired application temperature of the transparent electrode any sequence of deposition on the PEN substrate would adversely affect the fundamental ability of the PV foil to generate power.

Hence, a process is required which allows the roll-to-roll manufacture of a (relatively tough) photovoltaic foil or device, while at the same time making it possible to use any desired transparent conductor material and deposition process, and without jeopardizing the current-generating action of the PV layers. These requirements, and other desirable objects, are met by the process of the invention. To this end, the invention relates to a method of the aforementioned known type, which method comprises the following subsequent steps:

providing a temporary substrate,
applying the transparent conductor layer,
applying the photovoltaic layers,
applying the back-electrode layer
applying the (permanent) carrier
removing the temporary substrate, and, preferably,
applying a top coat on the side of the transparent conductor layer.

In a preferred embodiment of the invention, the transparent conductor layer is applied at a temperature higher than the one to which the photovoltaic layers are resistant (e.g., for a-Si:H, the maximum temperature to which the PV-layers are resistant is about the same as the deposition temperature of the said layers. Higher temperatures will cause loss of hydrogen and diffusion of dopants and impurities, thus forming defects that reduce the efficiency of the PV-layers).

These steps and their sequence essentially make it possible for PV cells to be produced in the form of a foil, while still maintaining the desired order of manufacture that is customary in the case of PV cells produced on glass substrates (in which case one can start by applying the transparent conductor since the glass will act as a window for it). Thus, when following the process of the invention, the substrate can be selected so as to allow any further process steps (like the high-temperature application of a transparent conductor layer) without any concerns about its (i.e. the substrate's) transparency or other properties needed for the functioning of the eventual PV foil. The temporary substrate is removed after the last of the photovoltaic layers, the back-electrode layer, and also a permanent carrier back-substrate have been applied, this in order to have the thin PV foil supported during as many process steps as possible and to ensure that the foil exhibits sufficient strength and bending stiffness (preferably adapted to the intended end product). After removal of the temporary substrate, the transparent conductor (front-electrode) will generally be provided with a transparent protective layer, which preferably further adds to the mechanical properties of the foil and/or the end product.

Although the transparent conductor layer will generally be deposited directly onto the temporary substrate (sometimes preceded by one or more extremely thin layers serving as a process aid), it is also possible after providing the temporary substrate to first apply the eventual protective layer on the said temporary substrate, and then the transparent conductor layer, followed by the other layers making up the foil. In this case the protective layer should, preferably, be made of an inorganic material.

Both the temporary substrate itself and the method to remove it (suitably by means of dissolving or etching) can be selected by the man skilled in the art without great difficulty. For example, the temporary substrate may be a "positive" photoresist, namely, a photosensitive material that upon irradiation undergoes a change from solvent-resistant to solvent-extractable, e.g., cross-linked polyimides. In order to meet the object of using low cost materials, these are not the substrates of preferred choice. In this respect, it is more advantageous to use polymers that can be removed by means of plasma etching (for example, $O_2$ plasma or, for example, for polysiloxane polymers, $SF_6$ plasma). While basically any polymer will thus be suitable, in view of the above it is, of course, preferred to employ polymers which can withstand higher temperatures (250° C. and more preferably above 400° C.).

By preference, the temporary substrate according to the present invention is a metal or metal alloy foil. The main reason for this is that such foils generally will be able to withstand the highest temperatures during further processing, suffer little from evaporation, and can be removed relatively easily using known etching techniques. Another reason to choose metal, notably aluminum or copper, is that the PV foil should eventually contain "side" electrodes (which form a contact for connection to any auxiliary apparatus or net, i.e., to actually use the PV foil as a source of power). By allowing part of the temporary substrate to remain in place (e.g., as side edges or stripes) these contacts do not need to be applied separately.

Suitable metals include steel, aluminum, copper, iron, nickel, silver, zinc, molybdenum, and alloys or multilayers thereof. For economic reasons it is preferred to employ Fe, Al, Cu, or alloys thereof. For the sake of performance (combined with costs) aluminum, electrodeposited iron, and electrodeposited copper enjoy the highest preference. Suitable etching techniques are known and, while different for each metal chosen, can be selected by the person skilled in the art using due skill. Preferred etchants include acids (Lewis acids, as well as Bronsted acids). For example, in the case of copper as a metal foil, it is preferred to use $FeCl_3$, nitric acid, or sulfuric acid. Aluminum can be efficiently removed by means of, for example, caustic soda (NaOH).

For the sake of removability, the temporary substrate preferably is as thin as possible. Of course it should still allow applying further layers onto it, and keeping these together, but this generally will not require thicknesses above about 500 $\mu$m. Preferably, the thickness is about 1 to about 200 $\mu$m. Depending on the modulus of elasticity, a majority of materials will require a minimum thickness of about 5 $\mu$m, in which case the preferred range is about 5 to about 100 $\mu$m, preferably about 5 to about 50 $\mu$m, thickness.

The permanent carrier material can be applied over the back-electrode layer, i.e., "on top" as seen from a process point of view, but in fact on the eventual back or bottom of the foil. Hence, the new carrier layer will eventually form a true substrate (the layer denoted "temporary substrate" during the process in fact is a "superstrate," as it is placed on the eventual front side or top of the foil). Suitable materials for this carrier layer include polymeric foils, such as polyethylene terephthalate, poly(ethylene 2,6-naphthalene dicarboxylate), polyvinyl chloride, or high-performance polymer foils such as aramid or polyimide foils, but also, e.g., metal foils provided with an insulating (dielectric) top layer, plate glass, or composites comprising epoxy and glass. Preferred are polymeric "co-extruded" foils comprising a thermoplastic adhesive layer having a softening point below that of the carrier itself. Optionally, the co-extruded foil is provided with an anti-diffusion layer (for instance, polyester (PET), copolyester, and aluminum respectively). The thickness of the carrier should preferably lie within the range of about 75 $\mu$m to about 10 mm. More preferred ranges are about 100 $\mu$m to about 6 mm and about 150 $\mu$m to about 300 $\mu$m. The bending stiffness (within the framework of the present invention being defined as the modulus of elasticity ('E' in N/mm$^2$) of the material multiplied by the thickness ('t' in mm) of the carrier cubed: Ext$^3$) preferably is larger than about 16×10$^{-2}$ Nmm and will usually be smaller than about 15×10$^6$ Nmm.

The carrier (the eventual substrate) itself may already be, or contain, a structure required for the intended use. Thus, the carrier may be, e.g., a tile or set of tiles, roof tiles, shingles, a car roof, a caravan roof, etc. However, in general, it is preferred that the temporary substrate and/or the carrier is flexible.

As mentioned above, a "top coat" or top layer is applied onto the transparent conductor. This will generally be a (cavity) plate or polymeric film having a high transmission, such as amorphous (per)fluorinated polymers, polycarbonate, poly(methyl methacrylate), or any available clear coat such as those used in the automotive industry. If so desired, an additional anti-reflection or anti-pollution layer may be applied.

It is further preferred that the bending stiffness of the foil after the last process step (which bending stiffness will usually be determined for the greater part by the carrier and the top coat) is greater than the bending stiffness of any one of the intermediate products.

It is noted that Japanese Patent Publication No. 1987/123,780 concerns a method of making photo-electric conversion films in which subsequently a TCO electrode, PV layers, and a further TCO electrode are deposited on a substrate. The substrate is then removed to give a very thin and highly flexible film. The addition of a supporting carrier, which is essential to the present invention and which results in a comparatively thick (e.g., about 100 $\mu$m) and rigid foil, would run counter to the teaching of Japanese Patent Publication No. 1987/123,780. Further, although this patent publication indeed discloses the use of a temporary substrate, it also proposes consistently and repeatedly to deposit a TCO on the PV layers. Thus, the use of a temporary substrate does not entail avoiding either the deposition of a TCO on the PV layers or the detrimental effects of said deposition on the PV layers.

U.S. Pat. No. 5,232,860 concerns a similar photovoltaic device of exceptional flexibility that is formed on a plate glass substrate. A lead layer is used to promote the detachment of the device from the glass substrate. Again, the addition of a carrier is not mentioned and would make the desired "exceptional flexibility" (which is the main objective of the technology of described in this U.S. patent) impossible and, again, a TCO may be deposited on the PV layers. A roll-to-roll process is not an option in the manufacture of the devices described in this U.S. patent because the temporary substrate should be made of glass or a similar material.

Japanese Patent Publication No. 1980/143,706 discloses the use of a removable substrate for the manufacturing of formed high-polymer products (such as films and ocellar or ommateal lenses) comprising a transparent electrically conductive layer. Photovoltaic cells (or products of a similarly complicated structure) and the problems encountered in such cells are not disclosed in this Japanese patent publication, which accordingly, has no bearing on the present invention.

European Patent Publication No. 189,976 concerns a method for the production of semiconductor devices (especially solar cells) similar to that of Shinohara et al. In the method according to this European patent document first the PV layers are built up and then the transparent conductor is applied to the PV layers.

Kishi et al., "Ultralight Flexible Amorphous Silicon Solar Cell and Its Application for an Airplane," Technical Digest of the International PVSEC-5, Kyoto, Japan, 1990, pages 645–648, discloses a solar cell manufactured by depositing the respective layers on a transparent plastic film. A temporary substrate is neither mentioned nor implied.

It is preferred that the temporary substrate is an electrodeposited (i.e., galvanic) metal layer. Besides allowing the provision of easily removable thin (< about100 $\mu$m) metal layers, this method has considerable advantages, particularly in respect of the working of the PV foil. Namely, in order for any PV cell to operate efficiently, it is desired that incident light be scattered through the PV structure as much as possible. To this end, the PV cell's surface, as well as the other layers', needs a certain texture, e.g., such that the surface comprises a plurality of optical prisms (which lead to incident light breaking and spreading through the PV cell). A great advantage of galvanically providing metal foil is that the galvanic (electrodeposition) process makes it possible to give the foil any desired texture. This texture can be obtained by texturing the surface (usually a drum) on which the metal is electrodeposited. When the PV foil is built up on a textured substrate, the substrate works as a mould, imposing on its adjacent layer, and the subsequent layers, the negative image of said texture (conformal coating). The desired drum surface can be attained in a manner known in itself, e.g., by laser engraving or by any photolithographic process. It is also possible to generate a textured surface on the side facing away from the drum. The texture at this side is not or not only affected by the surface texture of the drum and the material of which the drum is made, but also by such process parameters as the current density, the choice and concentration of the electrolyte employed, and by any additives used. The man skilled in the art knows how to adjust the relevant parameters and will be able to attain surface roughnesses of the order of about 0.1 to about 10 $\mu$m (perpendicular to the surface, $R_Z$).

While a scattering texture is preferred, more preferred is a texture comprising a plurality of adjacent pyramids, thus having alternating protrusions and indentations, the relative distance between which ($R_Z$) preferably is of the above order, and more preferably about 0.15 or 0.2 $\mu$m. It is further preferred that the protrusions and indentations have a rounded shape (e.g., an angle of basis to hypotenuse of maximally about 40°), in order to prevent possible defects in the amorphous silicon layers which may occur in the case of sharp peaks or sharp valleys. It is to be understood that if protruding pyramids are present on the surface of the drum or the like, the negative image thereof imposed on the temporary substrate and eventually on the transparent conductor and other layers will be a reverse pyramidal structure, having indentations rather than protrusions of pyramidal shape. Hence, by adjusting the texture of the temporary substrate the invention essentially allows the texture of the transparent conductor to be tuned in such a way as to eventually give it optimal surface morphology.

In view of the possibility of influencing the eventual texture, it is desired to choose copper for the electrodeposited metal foil. However, as copper may have the tendency to diffuse through the silicon PV layers, it is preferred to provide the copper foil (galvanically) with a non-reducing diffusion barrier, for example, an anti-corrosion layer, notably zinc oxide, or to select a transparent conductor which has the ability to prevent said diffusion, e.g., $TiO_2$, $Al_2O_3$, $SnO_2$, or ZnO. The anti-diffusion layers can be applied, e.g., galvanically by Physical Vapor Deposition (PVD) or by Chemical Vapor Deposition (CVD).

Instead of the copper foil being provided with an anti-diffusion layer, which, as a rule, will be removed with the temporary substrate, it is also possible to provide the copper foil (or any other temporary substrate chosen) with a layer of a suitable kind of glass. This glass layer essentially is transparent, and can thus be permanent, serving as a protective window for the transparent conductor layer. For reasons of economy, and to allow roll-to-roll processing, the glass layer preferably is very thin, e.g. about 100 to about 200 nm thickness. A suitable application method for such a layer, e.g., is PECVD (Plasma Enhanced Chemical Vapor Deposition) of $SiH_4$ and $N_2O$ (plasma oxide) and adding a suitable additive such as $B_2H_6$ to form a boron-silicate glass having a favorable transparency. It is preferred to apply APCVD silicon oxide.

After the temporary substrate has been provided in this manner, the layers actually making up the PV cells (in the form of a foil) can be provided. Broadly speaking, a PV cell of the thin film semiconductor type comprises a transparent conductor (which will eventually form the "front side" of the foil, i.e., the side which in use is to be irradiated with (sun)light), a plurality of thin film semiconductor layers which together exhibit a photovoltaic effect, such as a stack of p-doped, intrinsic, and n-doped amorphous silicon layers, and the back-electrode layer mentioned earlier, which preferably also serves as a reflector. Both the front side and the back can be provided with any desired protective layers, the main requirement for the front side being, of course, that such a layer is transparent, and further desired properties including good adhesion, wear, weather, and UV resistance, etc.

The transparent conductor (usually TCO—transparent conductive oxide) can be deposited in a known manner, e.g., using Metal Organic Chemical Vapor Deposition (MOCVD), sputtering, Atmospheric Pressure Chemical Vapor Deposition (APCVD), PECVD, spray pyrolysis, evaporation (physical vapor deposition), electrodeposition, screen printing, sol-gel processing, etc. It is preferred that the transparent conductor layer is applied at a temperature higher than about 250° C., preferably higher than about 400° C., so as to make it possible to obtain a transparent conductor layer having advantageous properties and/or texture.

Examples of materials suitable for use in the transparent conductor layer are indium tin oxide, zinc oxide, aluminum- or boron-doped zinc oxide, cadmium sulfide, cadmium oxide, tin oxide and, most preferably, F-doped $SnO_2$. This last transparent electrode material is preferred for its ability to form a desired crystalline surface having a columnar, light-scattering texture if applied at a temperature well above about 400° C., preferably about 500° C. to about 600° C. Particularly with this electrode material, the advantages of selecting a temporary substrate (which allows said high temperature) and, more particularly, selecting a textured electrodeposited metal substrate, are exhibited to a great extent. Further, the material has the advantage of being resistant to the most preferred etchants used, as well as having better chemical resistance and better opto-electronic properties than indium tin oxide. Besides, it is much less expensive.

After application of the transparent conductor layer, the PV foil can be built up as desired. It is known how to apply PV layers and also which layer configurations to choose. For the common general knowledge on this point reference is made to Yukinoro Kuwano, "Photovoltaic Cells," Ullmann's Encyclopedia, Vol.A20 (1992), 161, and to "Solar Technology," Ullmann's Encyclopedia, Vol.A24 (1993), 369.

Various thin film semiconductor materials can be used to make up the PV layers. Thus the required PV cells can be made from amorphous silicon (a-Si:H), microcrystalline silicon, polycrystalline amorphous silicon carbide (a-SiC) and a-SiC:H, amorphous silicon-germanium (a-SiGe) and a-SiGe:H. Further, the PV foils of the invention may comprise CIS PV cells (copper indium diselenide, $CuInSe_2$), cadmium telluride cells, Cu(In,Ga)Se cells, ZnSe/CIS cells, ZnO/CIS cells, Mo/CIS/CdS/ZnO cells.

In the preferred case of amorphous silicon cells comprising a fluorine-doped tin oxide, these will generally comprise a stack, or a plurality of stacks, of p-doped, intrinsic, and n-doped amorphous silicon layers, with the p-doped layers being situated on the side facing the incident light.

Thus, in the a-Si—H embodiment, the PV layers will at least comprise a p-doped amorphous silicon layer (Si-p), an intrinsic amorphous silicon layer (Si-i), and an n-doped amorphous silicon layer (Si-n). It may be that onto the first set of p-i-n layers a second and further p-i-n layers are applied. Also, a plurality of repetitive p-i-n ("pinpinpin" or "pinpinpinpin") layers can be applied consecutively. By stacking a plurality of p-i-n layers, the voltage per cell is raised and the stabilized efficiency is increased (light-induced degradation, the so-called Staebler-Wronski effect, is diminished). Furthermore, the spectral response can be optimized by choosing different band-gap materials in the various layers, mainly the i-layers, and particularly within the i-layers. The overall thickness of all the a-Si layers together will generally be of the order of about 100 to about 2000 nm, more typically about 200 to about 600 nm, and preferably about 300 to about 500 nm.

In order for the PV foil to be able to function properly in the various layers, in various positions, it is preferred that material be partially removed to create separated stripes of about 5 to about 100 mm, preferably about 5–25 mm, in order to provide the required electrically conductive through-connections for the PV cells in the foil to be in series (each p-i-n yields about 0.5 V at the maximum power point, and a plurality of p-i-n cells will generally be put in series to generate the desired voltage of a foil). This can be done in a known manner using a laser. Alternatively, it is also possible to employ (chemical) etching techniques to this end. In order to avoid the normally required number of process steps (coating of a photoresist, irradiating it through a mask, developing it, etching, rinsing, and stripping of the resist), the present invention provides a simple manufacturing tool which will eventually give the desired etching pattern. To this end, the invention in one embodiment provides a patterned coating of a thin layer of etchant on each layer. That this is possible results from the recognition that the layers in which etching is to be carried out are relatively thin, which will allow applying etchant-containing substances in a sufficient amount for etching to occur. While a typical thickness for each layer in the foil is of the order of a hundred to several hundreds of nm, the layers of etchant can be applied in thicknesses of, e.g., about 25 $\mu$m (=about 25000 nm) length and width. Since the different layers have different resistivity against etchants, it is possible for the eventual foil to contain several stripes of different etchants in the different layers. The required small stripes can be applied onto each layer during (roll-to-roll) processing of the PV foil. Suitable application techniques include flexogravure, rotation screen printing, ink jet, extrusion coating, transfer coating, etc. In other words, in each process step, after the application of each layer of which parts should be removed, etchant is so applied. Onto a layer of F-doped $SnO_2$, e.g., one applies a strong base such as KOH. The etching process can be accelerated by heating, which therefore may be an additional process step. For example, Al-doped ZnO can be removed by using an acidic etchant, such as sulfuric acid. Other transparent electrode materials can be etched away using the appropriate etchants generally known to the skilled man (e.g., indium tin oxide can be etched using KOH). Amorphous silicon can be etched using strong base such as NaOH or KOH. The back-electrode can be etched using acid.

Essentially, all etching steps can be conducted using the same apparatus, or set of stations, in which after allowing sufficient etching time the etched layer is washed/rinsed and dried. Since the process is conducted on a flexible (temporary) substrate, in each step of the entire manufacturing process there is question of a self-sustaining foil which can be led through various treatment stations (such as baths) by unwinding, and collected by rewinding. Although for this reason it is preferred to carry out all the etching steps when the temporary substrate is present, it is possible to partially remove the transparent conductor after removal of the temporary substrate.

It should be noted that, in principle, the above etching method is universally applicable to all processes in which thin film, e.g., amorphous silicon, PV cells or foils are produced.

The stripes of etchant preferably are as narrow as possible, e.g., about 1 to about 50 $\mu$m, and preferably about 20–25 $\mu$m or smaller, as at the site of these stripes the PV foil does not have current-generating activity.

After the active amorphous silicon layers have been applied, the PV foil is provided with the aforementioned back-electrode layer, which preferably can serve simultaneously as a reflector and as an electrode layer (i.e., as this eventually will be the "back" electrode, the transparent conductor layer will be a "front" electrode). This back-electrode layer will generally be of about 50 to about 500 nm thickness and may be made up of any suitable material having light-reflecting properties, preferably aluminum, silver, or a combination of layers of both. These metal layers can be applied (preferably at a relatively low temperature, e.g., lower than about 250° C.) by means of (in vacuo) physical vapor deposition (evaporation) or sputtering, optionally using a mask to prevent deposition at sites where stripes need to be etched or by use of masking wires. In the case of silver, it is preferred to first apply an adhesion promotion layer, for which, e.g., $TiO_2$ and ZnO are suitable materials and have the advantage of additionally being reflecting if applied in a suitable thickness (e.g. about 80 nm).

Like the layers applied previously, the back-electrode layers are made to contain "stripes," i.e. directly adjacent and parallel to the already existing stripes, narrow tracks of the reflector layer are removed. Again, this removal of material can be carried out using several techniques, such as laser scribing, wet chemical etching, plasma etching, or by "direct etch coating," i.e. the aforementioned deposition of etchant in preformed tracks. The etching of stripes from this "back electrode" serves to provide the necessary series connection for the individual PV cell created in the foil.

The above-indicated etching techniques can be applied in the subsequent removal of the temporary substrate. For example, the foil is passed through an etching bath comprising a strong base or $H_2SO_4$ or $FeCl_3$, or such Bronsted or Lewis acids are coated or sprayed onto the metal foil forming the temporary substrate. The removal of the substrate is followed by conventional rinsing and drying steps. If it is desired to only remove part of the temporary substrate (i.e. only at those parts of the surface where incident light needs to reach the transparent conductor), before etching an "etch resist" may be applied, preferably in narrow stripes at most covering two transparent conductor tracks.

Thus a ready-to-use PV foil is provided on a roll. If desired, sheets having a predetermined power and voltage can be cut from the foil.

In accordance with the above described technology, the invention further pertains to a method of manufacturing a thin film photovoltaic foil comprising as subsequent layers: a back-electrode layer, a plurality of photovoltaic layers, and a transparent conductor layer, the top electrodes and the back electrodes being connected in series, in which method tracks are defined in the back electrode prior to the application of the carrier and tracks are defined in the transparent conductive layer after the deposition of the photovoltaic layers and the back electrode and, preferably, after removal of the temporary substrate. It is further preferred that the tracks are defined preferably by laser scribing or etching. In the case of etching, it is preferred that a patterned coating of a thin layer of etchant is provided on the back electrode and/or the transparent conductive layer.

DESCRIPTION OF THE DRAWINGS

Without the following being intended as limiting the invention, by way of example a description is given of making a PV foil in accordance with the invention, with reference to the drawings. All figures depict a cross-section, at several stages of the manufacturing process, of one and the same portion of foil in the longitudinal (production) direction.

Figure 1:
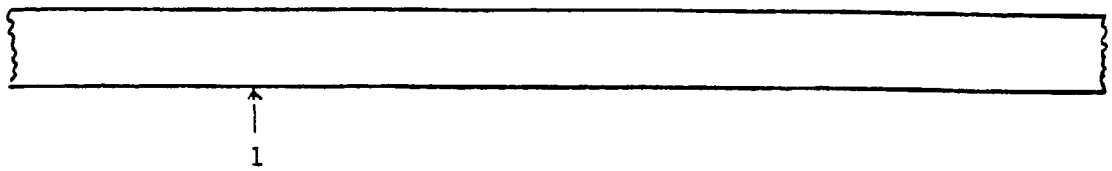
FIG. 1: a temporary substrate (1) in the form of a metal foil such as aluminum is provided.
Figure 2:
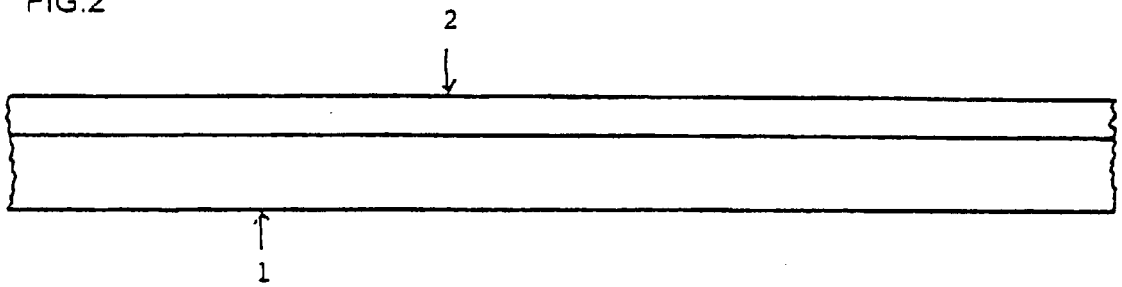
FIG. 2: a transparent conductor (2) is deposited onto the metal foil (1), e.g., a layer of F-doped $SnO_2$ of about 600 nm thickness applied by means of APCVD at about 550° C. Optionally, before the PV layers are applied, a ZnO intermediate layer (about 80 nm thickness) is deposited onto the transparent conductor layer (not shown)
Figure 3:
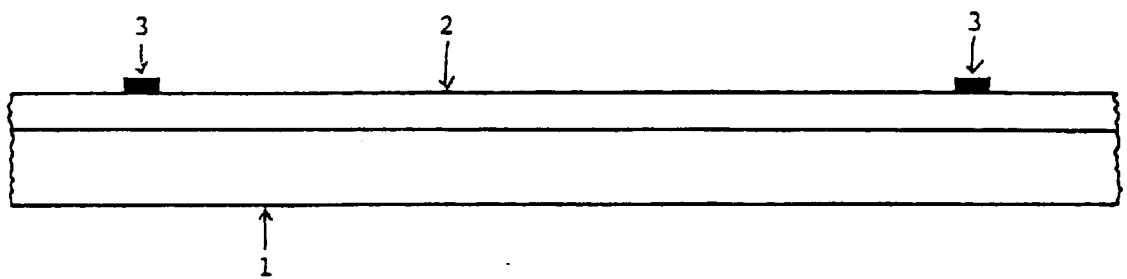
FIG. 3 and FIG. 4: the transparent conductor layer (2) is partially removed by means of laser scribing or by etching lines (3). The remaining parts are stripes (4) of about 20 mm width separated by narrow tracks (about 25 $\mu$m) of removed material (5)
Figure 4:
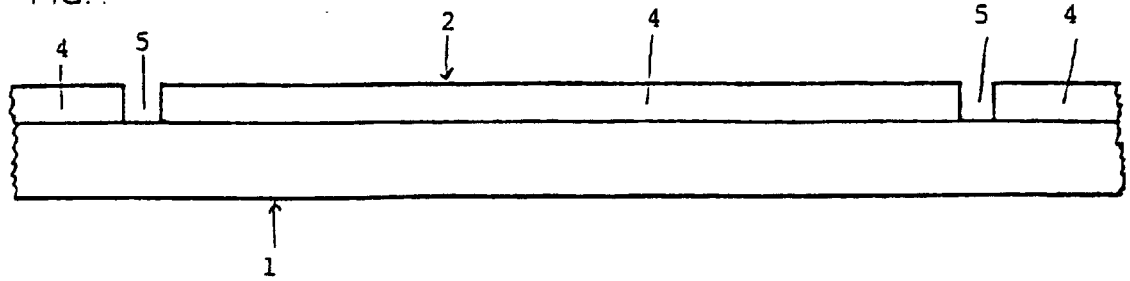
Figure 5:
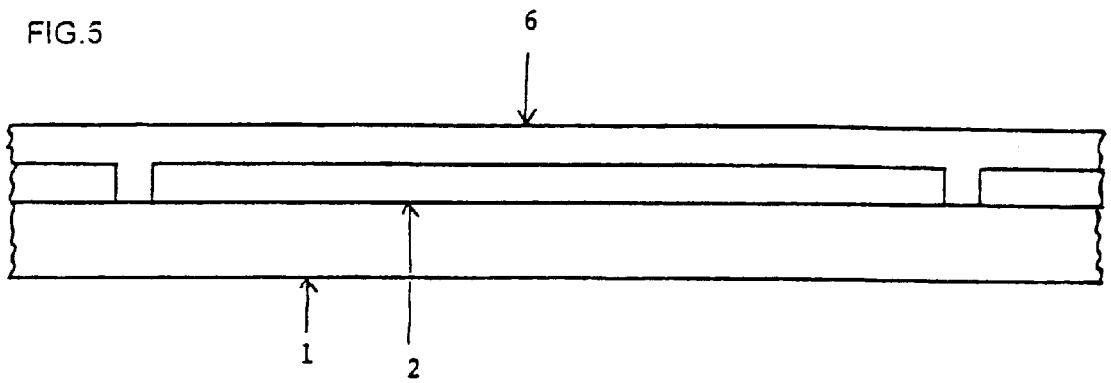
FIG. 5: the PV layers (6) are applied. These will comprise one or more sets of a p-doped amorphous silicon layer (Si-p), an intrinsic amorphous silicon layer (Si-i), and an n-doped amorphous silicon layer (Si-n), in an overall thickness of about 500 nm (not individually shown)
Figure 6:
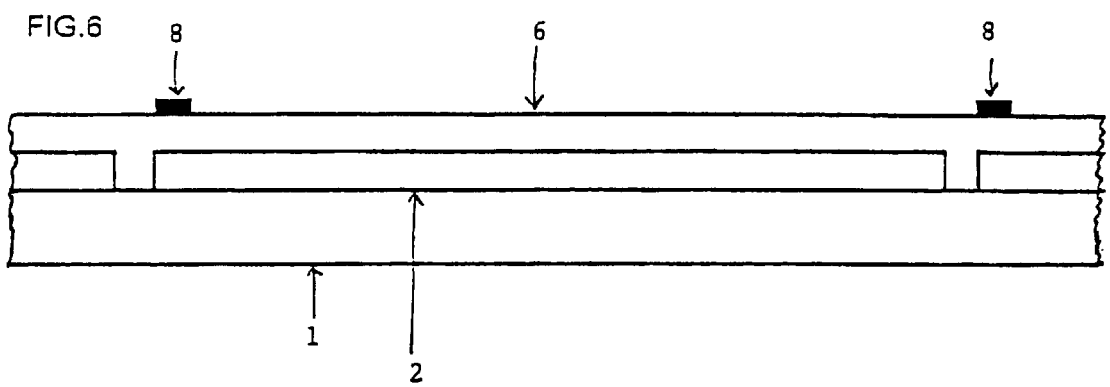
FIGS. 6 and 7: the amorphous silicon layers (6) are provided with a pattern of stripes (7) by removing narrow tracks of material by means of laser scribing or by applying chemical etchant (8). The tracks of removed material (9) are applied as close as possible to the removed tracks (5) in the transparent conductor layer.
Figure 7:
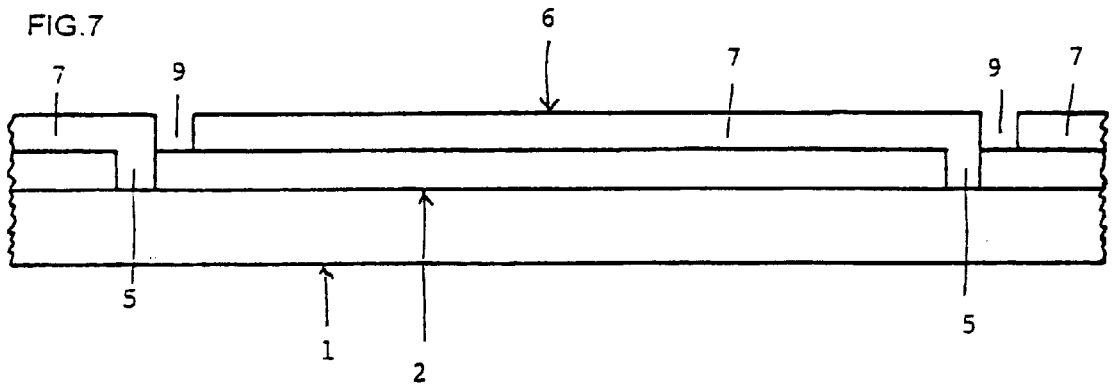
Figure 8:
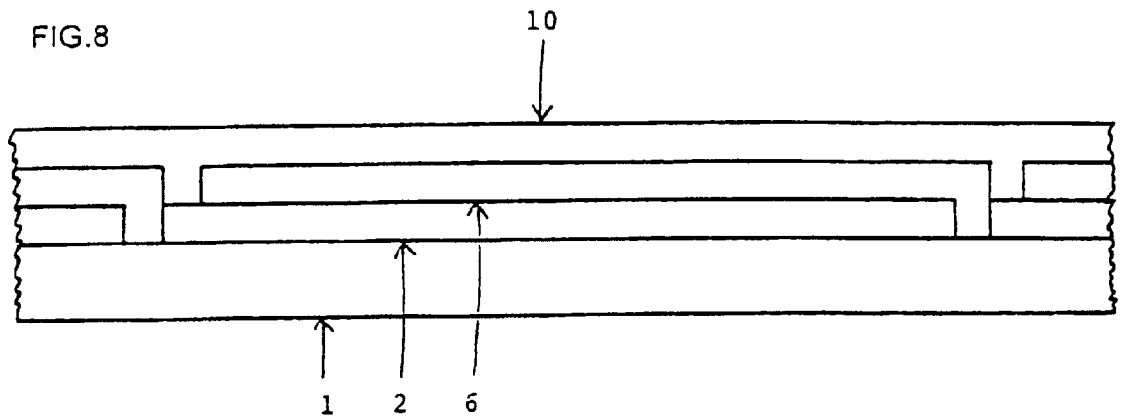
FIGS. 8 to 10: an aluminum layer (10) of about 250 nm thickness is applied onto the amorphous silicon layers (6) to serve simultaneously as a back-electrode and a reflector layer and provided with stripes (11) by etching away material in tracks (12) directly adjacent and parallel to those generated previously (9), possibly by first applying etchant (13)
Figure 9:
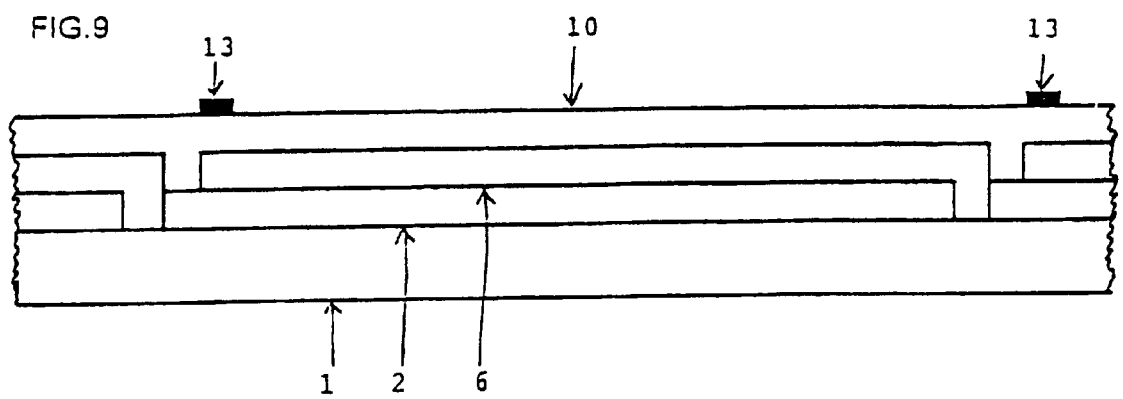
Figure 10:
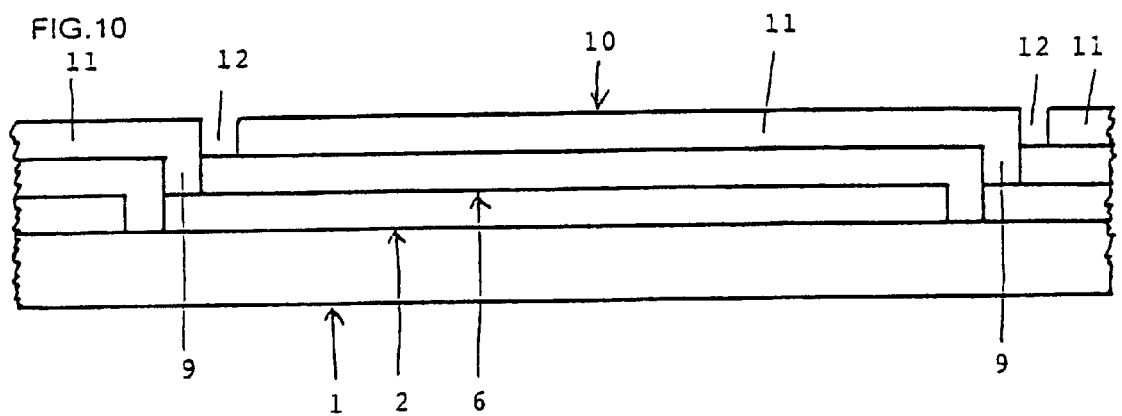
Figure 11:
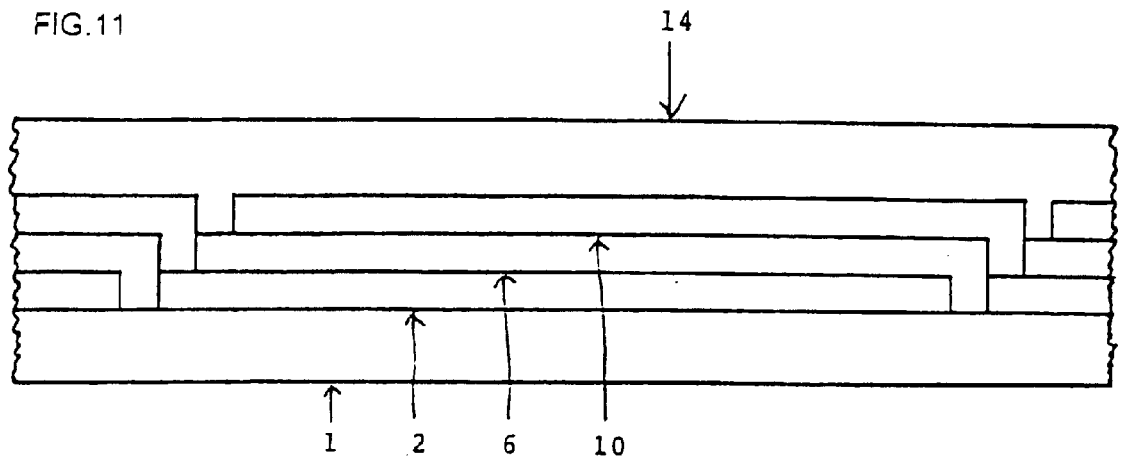
FIGS. 11 and 12: a carrier (14) is applied onto the back electrode (10), after which the metal foil temporary substrate (1) is removed (by etching). The carrier (14) in use will be the actual substrate (back, bottom) of the PV foil made in accordance with the invention.
Figure 12:
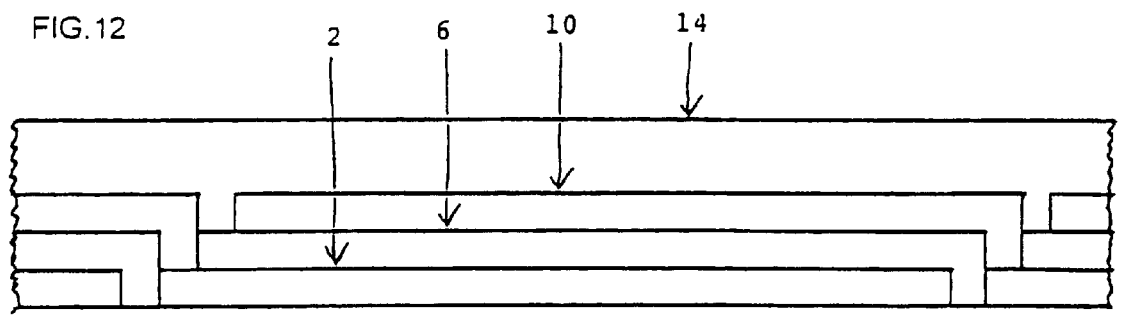
Figure 13:
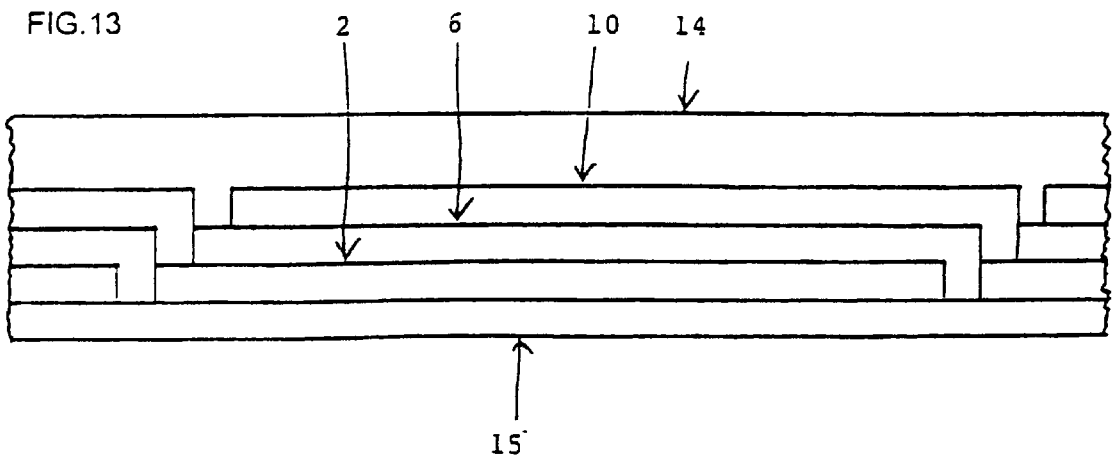
FIG. 13: the eventual front side comprising the transparent conductor layer (2) is provided with a protective clear top coat (15).

In a further embodiment according to the invention, the production of a cadmium telluride thin film solar cell is described. An aluminum temporary substrate was provided on which a layer of $SnO_2$:F was coated by means of APCVD at a temperature of about 550° C. Next, a layer of CdS (thickness: about 100 nm) was applied and subsequently annealed at about 400° C. in an $H_2$ atmosphere. After annealing the assembly was heated to about 550° C., and cadmium and tellurium were deposited on the CdS layer using a so-called closed space sublimation process in an He and $O_2$ atmosphere (source to substrate distance about 5 mm, the CdTe source was heated to about 650° C. and the substrate to about 550° C., both in an $H_2$ and $O_2$ atmosphere with a partial pressure of both gasses of about 30 Torr). The assembly was then treated with $CdCl_2$ vapor at about 425° C., followed by sputtering a back contact. Finally, the temporary substrate was removed by etching using an NaOH solution.

Besides pertaining to a method, the present invention also includes novel PV products, int. al., a photovoltaic foil comprising, as subsequent layers: a reflecting electrode layer, a plurality of photovoltaic layers, and a transparent conductor layer, with the foil, faced from the side of the transparent conductor layer, having a surface texture of indented, inverse pyramids.

Further, by virtue of the above manufacturing method involving the use of a temporary substrate, the present invention allows for substantial improvement of PV cells of the flexible, foil type. Thus, the invention also pertains to a photovoltaic foil comprising, as subsequent layers, a reflecting electrode layer, a plurality of photovoltaic layers, a transparent conductor layer, and a transparent protective coating, the improvement consisting in that the transparent conductor layer is fluorine-doped tin oxide. While this is a conductor known in itself, and highly desirable for PV cells, the state of the art processes do not allow it to be employed as the transparent conductor in PV foils. The present invention is the first to achieve a PV structure of the type having F-doped $SnO_2$ with the desired properties as a transparent conductor (and deposited at a temperature above about 400° C.) in the form of a flexible foil.

In fact, the present invention provides a PV material that may have an F-$SnO_2$, or other transparent conductor applied at high temperature, without this conductor layer necessarily being covered with a plate-glass window (which is the state of the art for PV cells having these transparent conductors).

What is claimed is:

1. A method of manufacturing a photovoltaic foil supported by a carrier and comprising a plurality of photovoltaic layers which together have the ability of generating electric current from incident light, a back-electrode layer on one side adjacent and parallel to the photovoltaic layers, and a transparent conductor layer on the other side of, and adjacent and parallel to the photovoltaic layers wherein the method comprises the following subsequent steps:

providing a temporary flexible substrate having a thickness of up to about 500 microns, applying the transparent conductor layer, applying the photovoltaic layers, applying the back-electrode layer, applying the carrier, and removing the temporary flexible substrate.

2. A method according to claim 1 wherein the carrier is flexible.

3. A method according to claim 1 wherein the transparent conductor layer is applied at a temperature higher than about 250° C., preferably higher than about 400° C.

4. A method according to claim 1 wherein the temporary flexible substrate is a metal foil of a metal, a metal alloy, or a metal multilayer.

5. A method according to claim 4 wherein the metal foil is an electrodeposited (galvanic) metal foil.

6. A method according to claim 4 or 5 wherein the metal is Al or Cu.

7. A method according to claim 1 wherein at least one surface of the transparent conductive layer is textured.

8. A method according to claim 1 wherein the bending stiffness of the foil after the last process step is greater than the bending stiffness of any one of the intermediate products.

9. A method as claimed in claim 1 wherein the temporary flexible substrate has a thickness of from about 1 to about 200 microns.

10. A method of manufacturing a photovoltaic foil supported by a carrier and comprising a plurality of photovoltaic layers which together have the ability of generating electric current from incident light, a back-electrode layer on one side adjacent and parallel to the photovoltaic layers, and a transparent conductor layer on the other side of, and adjacent and parallel to the photovoltaic layers wherein the method comprises the following subsequent steps:

providing a temporary flexible substrate, applying the transparent conductor layer at a temperature higher than the temperature to which the photovoltaic layers are resistant, applying the photovoltaic layers, applying the back-electrode layer, applying the carrier, and removing the temporary flexible substrate.

\* \* \* \* \*